(12) United States Patent
Eurlings et al.

(10) Patent No.: US 7,015,491 B2
(45) Date of Patent: Mar. 21, 2006

(54) LITHOGRAPHIC APPARATUS, DEVICE MANUFACTURING METHOD AND DEVICE MANUFACTURED THEREBY, CONTROL SYSTEM

(75) Inventors: Markus Franciscus Antonius Eurlings, Tilburg (NL); Noud Jan Gilissen, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 110 days.

(21) Appl. No.: 10/680,413

(22) Filed: Oct. 8, 2003

(65) Prior Publication Data

US 2004/0108467 A1 Jun. 10, 2004

Related U.S. Application Data

(63) Continuation-in-part of application No. 10/157,033, filed on May 30, 2002, now Pat. No. 6,737,662.

(30) Foreign Application Priority Data

Jun. 1, 2001 (EP) .................................. 01304850

(51) Int. Cl.
*G03B 27/54* (2006.01)
(52) U.S. Cl. ....................... 250/548; 250/492.1; 355/67
(58) Field of Classification Search ................ 250/548, 250/559.3, 559.4, 216, 201.5, 205, 492.1; 356/399–401; 355/53, 55, 67
See application file for complete search history.

(56) References Cited

U.S. PATENT DOCUMENTS

| 6,193,393 B1 | 2/2001 | Dove et al. .................. 362/251 |
| 6,597,431 B1 | 7/2003 | Benschop et al. ............ 355/69 |
| 6,859,515 B1 * | 2/2005 | Schultz et al. ................ 378/34 |

FOREIGN PATENT DOCUMENTS

| EP | 0 486 316 A2 | 5/1995 |
| EP | 0 744 641 A2 | 11/1996 |
| JP | 6-291023 | 10/1994 |
| JP | 8-313842 | 11/1996 |
| JP | 9-298154 | 11/1997 |
| JP | 11-3849 | 1/1999 |

* cited by examiner

*Primary Examiner*—Kevin Pyo
(74) *Attorney, Agent, or Firm*—Pillsbury Winthrop Shaw Pittman, LLP

(57) ABSTRACT

A lithographic projection system has an illumination system. A plurality of directing elements direct different sub-beams of an incident beam into predetermined directions. By using re-directing optics any desired angular intensity distribution of the beam can be produced. The illumination system includes a setting device that includes a reflector plate that supports reflectors. The reflectors are resiliently supported on the reflector plate. At least one aperture in the reflector plate is associated with each reflector. A setting plate includes at least one pin associated with each reflector. The pins of the setting plate are insertable into the apertures of the reflector plate. Each pin or pins engages its associated reflector to control the orientation of the associated reflector by rotation about two axes substantially perpendicular to the optical axis of the associated reflector.

22 Claims, 10 Drawing Sheets

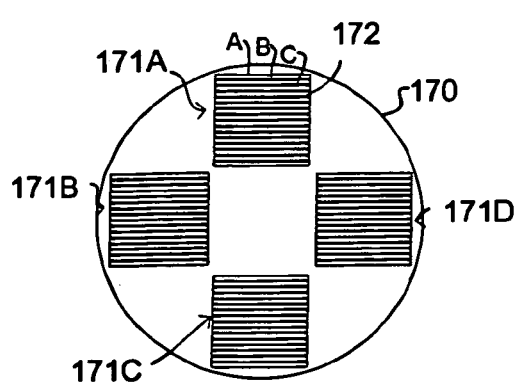
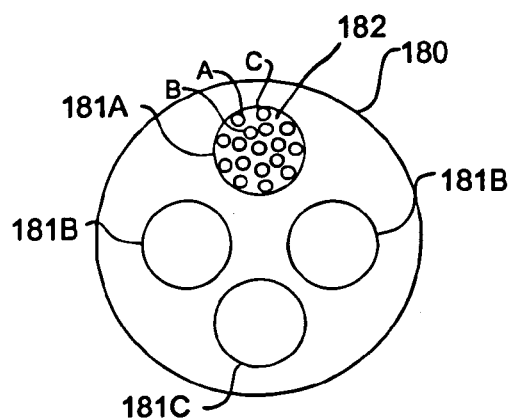
Fig. 13  Fig. 14
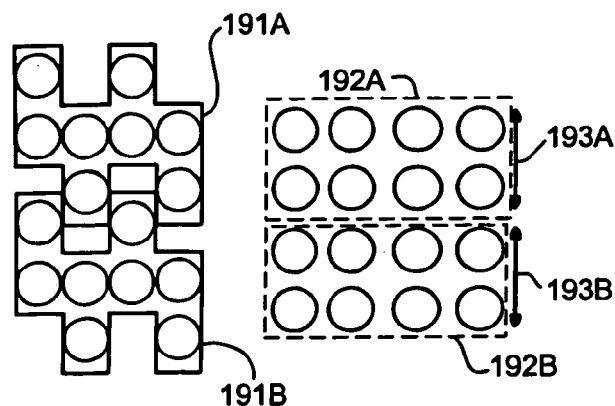
Fig. 15

LITHOGRAPHIC APPARATUS, DEVICE MANUFACTURING METHOD AND DEVICE MANUFACTURED THEREBY, CONTROL SYSTEM

CROSS REFERENCE TO RELATED APPLICATIONS

This application is a continuation-in-part of co-pending U.S. application Ser. No. 10/157,033, entitled "LITHOGRAPHIC APPARATUS, DEVICE MANUFACTURING METHOD, DEVICE MANUFACTURED THEREBY, CONTROL SYSTEM, COMPUTER PROGRAM, AND COMPUTER PRODUCT," filed May 30, 2002, now U.S. Pat. No. 6,737,662, which claims priority to European Patent Application No. 01304850.9, filed Jun. 1, 2001, the entire contents of both applications are incorporated herein by reference.

BACKGROUND OF THE INVENTION

1. Field of the Invention

The present invention relates to a lithographic projection apparatus, a device manufacturing method and a device manufactured thereby.

2. Description of the Related Art

The term "patterning device" as here employed should be broadly interpreted as referring to device that can be used to endow an incoming radiation begin with a patterned cross-section, corresponding to a pattern that is to be created in a target portion of the substrate. The term "light valve" can also be used in this context. Generally, the pattern will correspond tog particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a pattering device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the minors are matrix-addressable, such that addressed mirrors will reflect an incoming radiation beam in a different direction to unaddressed minors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT patent applications WO 98/38597 and WO 98/33096, which are incorporated herein by reference. In the case of a programmable mirror array, the support may be embodied as a frame or table, for example, which may be fixed or movable as required.

Another example of a pattering device is a programmable LCD array. An example of such a construction is given in U.S. Pat. No. 5,229,872, which is incorporated herein by reference. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. More information with regard to lithographic devices as here described can be seen, for example, from U.S. Pat. No. 6,046,792, incorporated herein by reference.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer.

Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

A projection apparatus, such as used in lithography, generally includes an illumination system, referred to hereafter simply as an illuminator. The illuminator receives radiation from a source, such as a laser, and produces a beam for illuminating an object, such as the patterning device (e.g. a mask on a mask table). Within a typical illuminator, the beam is shaped and controlled such that at a pupil plane the beam has a desired spatial intensity distribution. This spatial intensity distribution at the pupil plane effectively acts as a virtual radiation source for producing the beam. Following the pupil plane, the radiation is substantially focussed by a lens group referred to hereafter as "coupling lens". The coupling lens couples the substantially focussed radiation into an integrator, such as a quartz rod. The function of the integrator is to improve the homogeneity of the spatial and/or angular intensity distribution of the projection beam. The spatial intensity distribution at the pupil plane is converted to an angular intensity distribution at the object being illuminated by the coupling optics, because the pupil plane substantially coincides with the front focal plane of the coupling optics. Controlling the spatial intensity distribution at the pupil plane can be done to improve the processing latitudes when an image of the illuminated object is projected onto a substrate. In particular, spatial intensity distributions with dipole, annular or quadrupole off-axis illumination profiles have been proposed to enhance the resolution and other parameters of the projection, such as sensitivity to projection lens aberrations, exposure latitude and depth of focus.

A known illuminator comprises an optical system referred to hereafter as "zoom-axicon". The zoom-axicon is a device that adjusts the intensity distribution at the pupil plane. Radiation from the source passes through a first optical element, which gene-rates an angular intensity distribution, such as for example a diffractive optical element (DOE). Next, the radiation beam traverses a zoom lens. In the back focal plane of the zoom lens a spatial intensity distribution occurs that generally is suitable to serve as a secondary light source in the pupil plane. Hence the back focal plane of the zoom lens typically substantially coincides with the pupil plane (i.e. the front focal plane of the coupling optics). The outer radial extent of the spatial intensity distribution at the pupil plane can be changed by changing the focal length of the zoom lens. However, the zoom lens must have two degrees of freedom, one to change the focal length of the zoom lens and a second to change the position of the principal planes such that when the focal length changes, the back focal plane remains located at the pupil plane of the illuminator. Due to this functionality, the zoom lens typically consists of several (e.g. at least three) separate lenses in series, several of which are movable. As mentioned above, by tuning the focal length of the zoom lens, the radial extent of the intensity distribution at the pupil plane can be set. In the following, any preselected, preferred spatial intensity distribution at the pupil plane may be referred to as an "illumination setting".

An axicon, which is located near the pupil plane, generally consists of two elements having complimentary conical shaped faces. The axicon is used to generate annular spatial intensity distributions, or other spatial intensity distributions with substantially no intensity around their center, i.e. no on-axis illumination. By tuning the distance between the two conical faces of the axicon, the annularity can be adjusted. When the axicon is closed, i.e. the gap between the conical faces is zero, conventional, (i.e. disc-like) illumination settings can be produced. With a gap between the conical faces, an annular intensity distribution results, with the inner radial extent of the annulus determined by the distance between the two conical faces. On the other hand the zoom lens determines the outer radial extent and thus the width of the annulus. Preselected inner and outer radial extents of the intensity distribution are often referred to as σ-settings, in particular the σ-inner settings and the σ-outer setting, respectively. Here, σ-inner and σ-outer are a measure for the ratio of the radius in question to the maximum radius of the pupil.

The term "zoom-axicon" as employed here should be interpreted as referring to a module comprising a zoom lens and an axicon.

Multiple illumination settings can be generated by various device in the known illuminator, for example by modifying the first optical element in front of the zoom lens, such as to appropriately shape the angular intensity distribution, or by inserting aperture plates or blades into the beam path, for instance near a pupil plane, and so on. Further information on a known zoom-axicon module and multipole mode generation are given, for example, in U.S. Pat. No. 6,452,662, incorporated herein by reference.

In the known illuminator, described above, it is apparent that to produce the desired range of illumination settings the zoom-axicon module will generally have several (e.g. five or more) optical components, which can make it expensive to produce, particularly given the fact that several of the elements must be independently movable. A further problem is that the lenses comprising the zoom lens and the two conical elements of the axicon represent a considerable thickness of lens material and a large number of surface interfaces. This means that the transmission efficiency can be poor due to absorption, reflection, inefficient coatings, degradation effects and contamination. This problem is exacerbated by the demand for imaging ever smaller features at higher densities, which requires the use of radiation with shorter wavelengths, such as 193, 157, 126 nm or even EUV (e.g. 5–20 nm). The efficiency of suitable transmissive materials, such as $CaF_2$ and quartz, decreases at shorter wavelengths due to increased absorption and no materials are known that are sufficiently transmissive for EUV radiation. The effectiveness of the optical coatings of the components also typically decreases at shorter wavelengths and degradation effects generally become worse. Thus, overall, a significant throughput reduction can occur, due to decreased transmission. Another problem is that the known illuminator occupies a relatively large volume in the lithography apparatus. This in turn can lead to excess bulk in the machine, and increased manufacturing costs (particularly when using material such as $CaF_2$).

As mentioned above, spatial intensity distributions with dipole, annular or quadrupole off-axis illumination profiles can enhance the projection properties. The choice of the profile depends on, amongst others, the respective application of the lithographic process. To provide a desired non-standard illumination mode for a given application, requires dedicated optical devices which must be specially designed at considerate effort and expense.

U.S. Pat. No. 5,684,566 describes an illumination system for use in a lithography apparatus which uses a deformable mirror to improve the uniformity of illumination of the mask.

U.S. Pat. No. 6,252,647 describes various different lithography apparatus including a variety of different arrangements for providing dipole and quadrupole illumination settings. These include arrangements using fiber bundles whose exit points are moveable to define the pole positions. Other arrangements use a mirror shiftable between two positions during an exposure or between shots of a multishot exposure.

SUMMARY OF THE INVENTION

An aspect of the present invention is to provide an improved lithography apparats with an illuminator which avoids or alleviates the above problem. A further object is to provide devices which can be used to generate predetermined intensity distributions of the beam.

According to one aspect of the present invention there is provided a lithographic apparatus including a radiation system configured to provide a beam of radiation; a support configured to support a patterning device, the patterning device configured to pattern the beam according to a desired pattern; a substrate table configured to hold a substrate; and a projection system configured to project the patterned beam onto a target portion of the substrate, wherein the radiation system includes an illumination system configured to define an intensity distribution of the beam, the illumination system including a setting device configured to direct different parts of an incoming radiation beam into different directions to provide a desired angular intensity distribution of the beam at the patterning device, the setting device including a plurality of directing elements, each directing element configured to direct a corresponding pan of the incoming radiation beam, and an orientation of each directing element is set to direct the corresponding part of the beam into a desired direction.

Another aspect of the present invention is the provision of the plurality of directing elements. Preferably, the directing elements can be oriented to direct their corresponding part of the beam into a desired direction. The resulting angular intensity distribution can then be transformed into a spatial intensity distribution, for example by a focusing lens. Examples of directing elements are reflectors, which reflect the incident radiation into a direction or range of directions, and a diffractive elements, such as DOE's, which diffract and thereby diverge the incident radiation. Any other type of elements, for example mirrors or refractive elements such as lenses or wedges, which are capable of directing radiation into a specific direction or range of directions or into plural directions can be used as the directing elements, as long as the direction or the directions can be controlled. The control is performed by directly or indirectly changing the directing properties and/or the orientation of each directing element.

According to another aspect of the present invention, the illumination system includes a setting device including a reflector plate configured to support reflectors; at least one resilient member associated with each reflector and configured to resiliently support each reflector on the reflector plate; at least one aperture in the reflector plate associated with each reflector; and a setting plate including at least one pin associated with each reflector, wherein the pins of the setting plate are insertable into the apertures of the reflector plate, each at least one pin engaging its associated reflector to control the orientation of the associated reflector by rotation about two axes substantially perpendicular to the optical axis of the associated reflector.

Recently, micro-electromechanical and micro-opto-electro-mechanical systems (MEMS and MOEMS) have been developed for use as optical switches in devices for optical data transmission. Some of these MEMS comprise arrays with more than 1000 microscopic mirrors wherein each of the mirrors can be tilted in two different planes perpendicular to each other. Thus, radiation incident on such devices can be reflected into (substantially) any desired direction of a hemisphere. Such an array of reflective elements can be used as the plurality of discrete mirrors oriented to reflect projection radiation into different pre-determined directions.

An important advantage of the present invention lies in the fact that it can be applied to EUV radiation to provide predetermined intensity distributions. It has up to now not been possible to provide a zoom-axicon or equivalent device that would function with EUV radiation.

In a particular embodiment of the invention, the illumination mode setting device includes a first faceted mirror, each of the mirrors being a facet of the first faceted mirror and configured to project an image of a radiation source onto a selected facet of a second faceted mirror by setting of the orientation thereof. In this arrangement, the first faceted mirror acts as a field mirror and a fly's-eye reflector, creating a large number of virtual sources on the second faceted mirror which are then redirected to overlap on the mask, providing the desired uniformity of illumination. Preferably, the second faceted mirror is in a plane conjugate with the pupil plane of the projection system so that the illumination of the second faceted mirror determines the illumination mode of the mask. Thus, the illumination mode can be set by setting the orientation of the facets of the first faceted mirror to illuminate selected ones of the facets of the second faceted mirror. This avoids the loss of beam intensity that would occur if the illumination mode is set by selective masking in a pupil plane.

The present invention is not limited to the case that the radiation source provides a single beam of radiation. Rather, different sub-beams or bundles of sub-beams can be generated at different locations and can be set by the setting device to produce the desired angular intensity distribution. Furthermore, the beam or at least one of the beams can be split up to form separate sub-beams before reaching the directing elements. The angular intensity distribution may be somewhat influenced by the manner in which the beam or beams is generated or manipulated before reaching the directing elements, but the control of the directing elements enables the user to produce the desired angular intensity distribution by choosing from a wide range of possible distributions. In particular, it is preferred that the directing elements can be set to direct each incident part of the projection radiation into (substantially) any direction of a hemisphere.

As described above, a predetermined spatial intensity distribution is to be produced in some cases. In these cases, it is preferred to produce a corresponding angular intensity distribution and to use a re-directing element to at least a part of the steered beam to produce the desired spatial intensity distribution in a cross-section of the beam, in particular in a focal plane. In particular, if focusing optical elements are used, such as a convex lens, each of the different directions of radiation propagation (of the produced angular intensity distribution) corresponds to one particular area of the spatial intensity distribution, in particular to one specific local point in a focal plane.

Different shapes and/or profiles of such a spatial intensity distribution such as annular, quadrupole, dipole and (soft) multipole, have been proposed. The present invention enables the user of a lithographic projection apparatus to produce a predetermined spatial intensity distribution, for example with arbitrary, definable shapes.

According to a preferred aspect of the invention, at least some of the sub-beams are set and re-directed so that they correspond to spots or dashes of radiation in the cross-section in which the spatial intensity distribution is defined. Thus, the spatial intensity distribution has a profile with a discrete character. Depending on the size of the spots and/or dashes, and thereby depending on the size of the range of directions into which a single sub-beam is set by the setting device, the spatial intensity distribution can include zones where the intensity is zero or almost zero (non-illuminated or dark zones) between illuminated areas.

In a preferred embodiment, the range of directions into which a single sub-beam propagates is influenced so that there is a sufficiently continuous intensity distribution. It is possible to influence the respective sub-beam or beams before the beam reaches the directing element and/or afterwards. In one particular embodiment, the sub-beams are set so that they each propagate essentially to a single point. The points can be the same or different for the different sub-beams. One advantage of this embodiment is that the sub-beam can easily be adjusted to be incident on the directing element in the correct place. Further, undesired boundary effects due to radiation which is incident at the boundaries of the directing element can be reduced or avoided. For example, if the directing element is a reflective element with a given size of a reflective area, the arrangement can be adjusted so that the sub-beam is incident on the reflective element in the central zone of the reflective area.

To increase the range of propagation directions of the directed sub-beam, a diffuser device, such as a diffuser plate, can be used. However, this also may affect the polarization of the sub-beam and can make it difficult or impossible to exploit the polarization in subsequent stages.

In another embodiment, the sub-beam or beams are therefore manipulated before reaching the directing element or elements. In particular, the respective sub-beam is manipulated so that the directed sub-beam propagates into a defined range of propagation directions. For example, this can be done using a concentrating element to concentrate the sub-beam onto the directing element. The concentration also has the advantage that the sub-beam is incident on the directing element at the correct place, e.g. the central zone of a reflective area.

In addition, or alternative to the embodiments described before, the range of propagation directions of the sub-beam or beams can be increased using the directing element or elements. In particular, the reflective surface area of a reflective element can be shaped accordingly, for example to have a convex or concave shape.

The term "sub-beam" as here employed should not be interpreted in a limiting way regarding the intensity distribution of the beam or beams before reaching the directing elements. Rather, the respective beam can be a single beam with a continuous intensity distribution, but, at the same time, can be considered to include a bundle of sub-beams. At least some of the sub-beams may become individual beams, separated from other parts of the beam, after being directed by the setting device. In any case, each sub-beam corresponds to a related part of the originally generated beam or beams.

According to a further aspect of the invention there is provided a device manufacturing method including providing a beam of radiation; modifying the intensity distribution of the beam; using a patterning device to endow the modified beam with a pattern in its cross-section; and projecting the patterned beam of radiation onto a target which comprises at least a part of the radiation-sensitive material, wherein the modification of the intensity distribution of the projection beam includes setting the direction into which the radiation propagates using a setting device according to the present invention, wherein the beam comprises a plurality of sub-beams, wherein at least some of the sub-beams are directed into different directions using a plurality of reflectors, and orientations of the reflectors are set to direct the corresponding sub-beam into a desired direction.

In general, it is not possible to produce any theoretically possible angular intensity distribution. In particular, if the setting device includes directing elements as described above, there will be some discrete character of the intensity distribution due to the fact that each directing element directs the corresponding part of the beam into a limited range of directions only. Depending on the number of directing elements, on their characteristic properties, and other factors, the discrete character of the intensity distribution will be more or less pronounced.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the present invention will now be described, by way of example only, with reference to the accompanying schematic drawings in which:

FIGS. 13 and 14 schematically illustrate field and pupil faceted mirrors, respectively, of the fourth embodiment of the present invention;

FIG. 15 schematically illustrates grouped facets according to a variant of the fourth embodiment.

In the Figures, like symbols indicate like parts.

DETAILED DESCRIPTION

Figure 1:
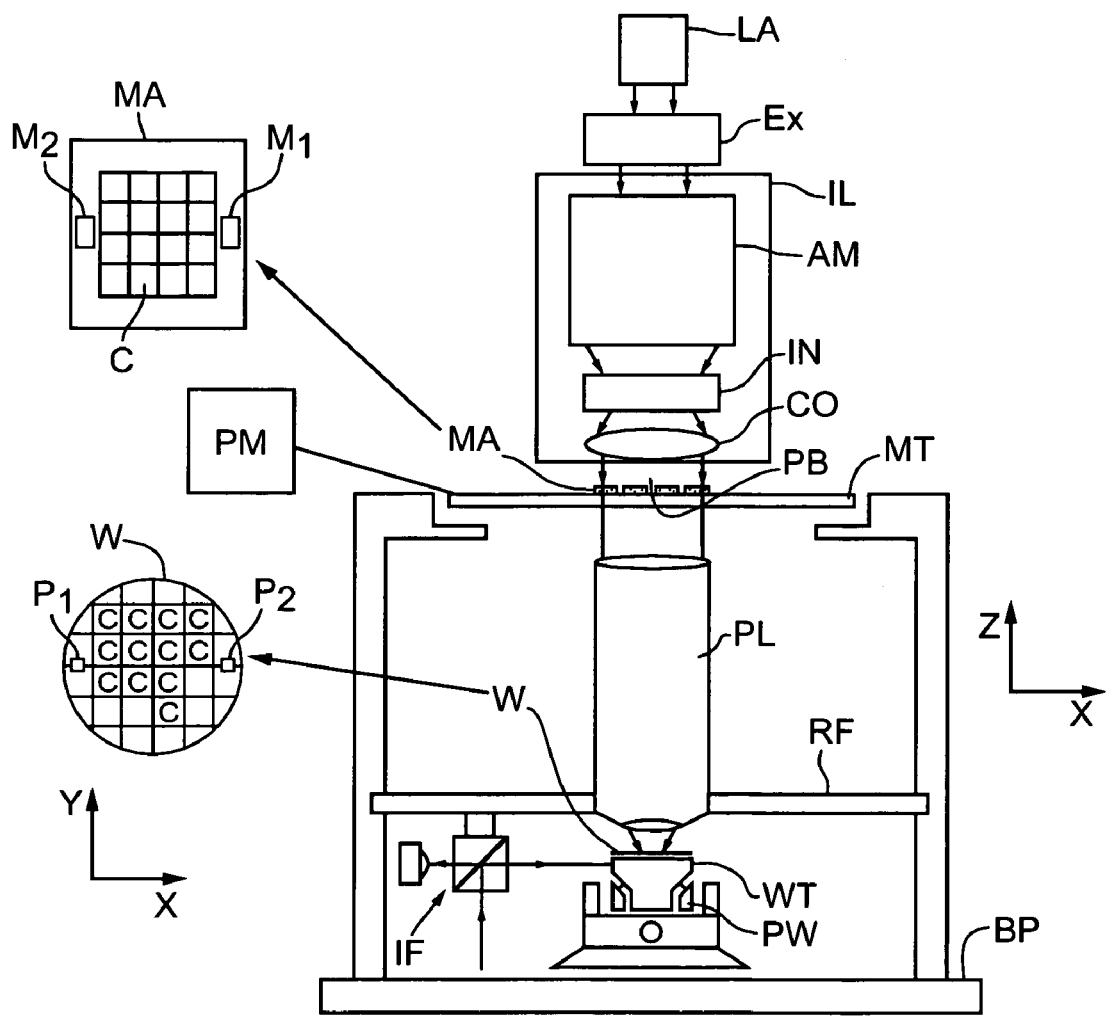
FIG. 1 schematically illustrates a lithographic projection apparatus according to a first embodiment of the present invention.

FIG. 1 schematically depicts a lithographic projection apparatus 1 according to an embodiment of the present invention. The apparatus includes a base plate BP. The apparatus may also include a radiation source LA (e.g. UV or EUV radiation, such as, for example, generated by an excimer laser operating at a wavelength of 248 nm, 193 nm or 157 nm, or by a laser-fired plasma source operating at 13.6 nm). A first object (mask) table MT is provided with a mask holder configured to hold a mask MA (e.g. a reticle), and is connected to a first positioning device PM that accurately positions the mask with respect to a projection system or lens PL. A second object (substrate) table WT is provided with a substrate holder configured to hold a substrate W (e.g. a resist-coated silicon wafer), and is connected to a second positioning device PW that accurately positions the substrate with respect to the projection system or lens PL. The projection system or lens PL (e.g. a quartz and/or $CaF_2$ lens system or a refractive or catadioptric system, a mirror group or an array of field deflectors) is configured to image an irradiated portion of the mask MA onto a target portion C (e.g., comprising one or more dies) of the substrate W.

The projection system PL is supported on a reference frame RF. As here depicted, the apparatus is of a transmissive type (i.e. has a transmissive mask). However, in general, it may also be of a reflective type, (e.g. with a reflective mask). Alternatively, the apparatus may employ another kind of patterning device, such as a programmable mirror array of a type as referred to above.

The source LA (e.g. a UV excimer laser, an undulator or wiggler provided around the path of an electron beam in a storage ring or synchrotron, a laser-produced plasma source, a discharge source or an electron or ion beam source) produces radiation. The radiation is fed into an illumination system (illuminator) IL, either directly or alter having traversed a conditioner, such as a beam expander Ex, for example. The illuminator IL may comprise an adjusting device AM configured to set the outer and/or inner radial extent (commonly referred to as σ-outer and σ-inner, respectively) of the intensity distribution in the beam. In addition, it will generally comprise various other components, such as an integrator IN and a condenser CO. In this way, beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). The latter scenario is often the case when the source LA is an excimer laser. The present invention encompasses both of these scenarios.

In particular, the present invention encompasses embodiments wherein the illuminator IL is configured to supply a beam of radiation having a wavelength of less than about 170 nm, such as with wavelengths of 157 nm, 126 nm and 13.6 nm, for example.

The beam PB subsequently intercepts the mask MA, which is held on the mask table MT. Having traversed the mask MA, the beam PB passes through the lens PL, which focuses the beam PB onto a target portion C of the substrate W. With the aid of the second positioning device PW and interferometer(s) IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_1$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g. the Y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
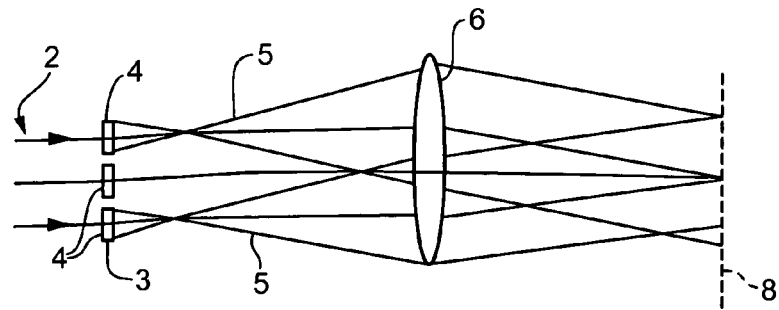
FIG. 2 schematically illustrates the transformation of an angular intensity distribution to a spatial intensity distribution according to a prior art arrangement.

FIG. 2 illustrates the principle of corresponding angular and spatial intensity distributions of a radiation beam. According to a prior-art arrangement, elements for setting the outer and/or inner radial extent σ-outer and σ-inner, respectively, include a diffractive optical element ("DOE") 3 with an array of micro-lenses 4. Each micro-lens 4 forms a divergent pencil 5 of rays. Each pencil 5 of rays corresponds to a part or sub-beam of the beam which is incident at the DOE 3. The pencils 5 will be incident at focusing lens 6. In the back focal plane 8 of the lens 6, each pencil 5 corresponds to an illuminated area. The size of the area depends on the range of directions into which the rays of the pencil 5 propagate. If the range of directions is small, the size of the illuminated area in the back focal plane 8 is also small. Furthermore, all identical directions of the pencils 5, i.e. all rays which are parallel to each other, correspond to one and the same particular point in the back focal plane 8.

Figure 4:
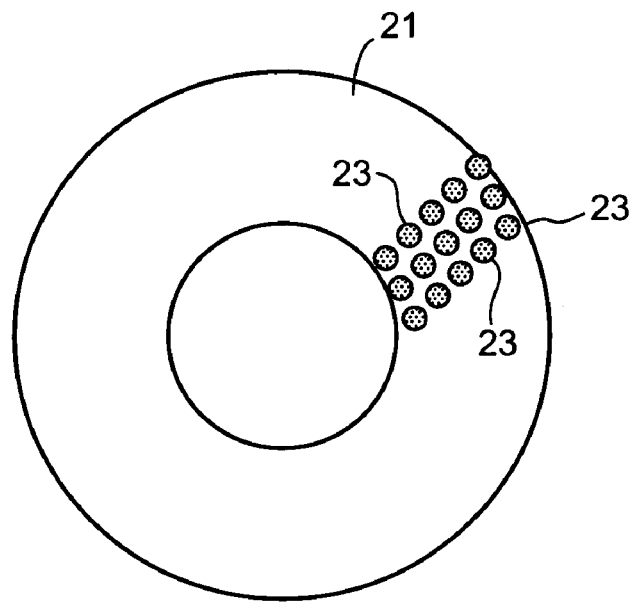
FIGS. 4 and 5 schematically illustrate two similar spatial intensity distributions.
Figure 5:
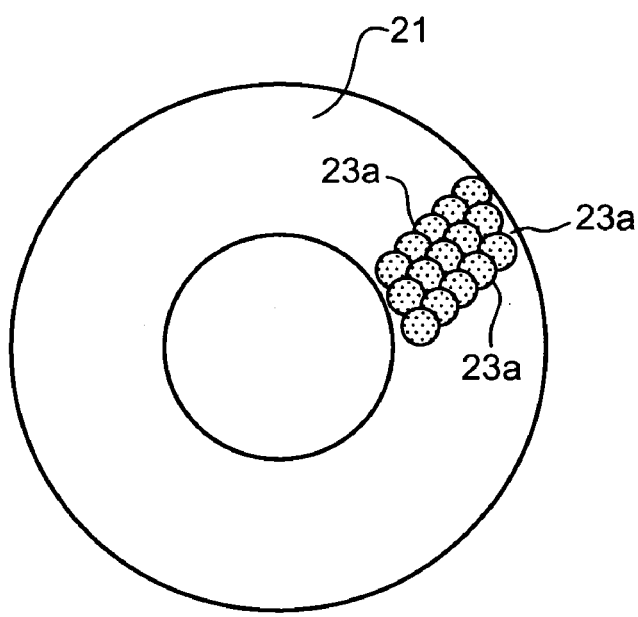

It is known to produce a spatial intensity distribution in a cross-sectional area of the beam, in particular in a pupil plane, which has an annular shape (as illustrated in FIGS. 4 and 5 by two concentric circles). The inner radial extent which corresponds to the central area with an intensity of zero or close to zero, can be set by the axicon. However, the number of possible intensity distributions is limited and a change of the illumination setting requires time consuming replacement of micro-lenses 4.

Figure 3:
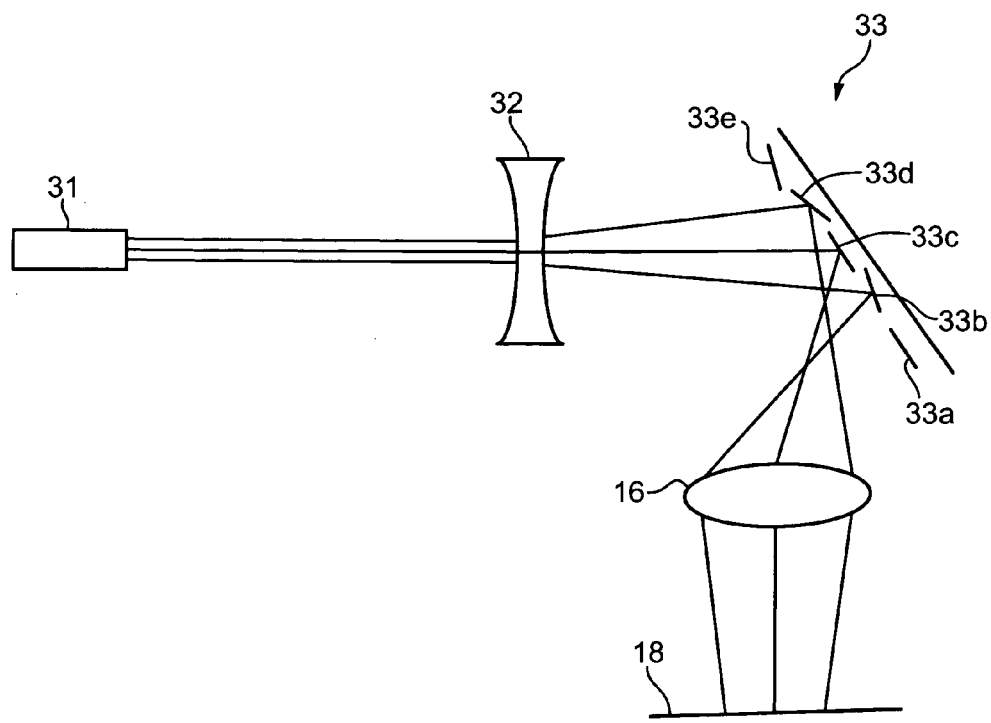
FIG. 3 shows in more detail the radiation system of the first embodiment of the present invention.

FIG. 3 shows the arrangement of the radiation system according to a first embodiment of the present invention. A laser 31 outputs a relatively narrow, collimated beam which passes through beam divergence optics 32 which expand the beam to a size which corresponds to the size of an array 33 of reflective elements 33a, 33b, 33c, 33d, 33e. Ideally, the beam divergence optics 32 should output a collimated beam. However, at the edges of the beam there may be a divergence difference. Preferably, the size of the expanded beam is sufficient that the beam is incident at all reflective elements 33a to 33e. In FIG. 3, by way of example, three sub-beams of the expanded beam are shown. The beam divergence optics may alternatively include a positive lens or lens array positioned after the back focal point.

A first sub-beam is incident at reflective element 33b. Like the other reflective elements 33a, 33c to 33e of the array 33, the reflective element 33b is controlled to adjust its orientation so that the sub-beam is reflected into a desired pre-determined direction. By re-directing optics 16, which may be, for example, a focusing lens, the sub-beam is re-directed so that it is incident at a desired point or small area in a cross-sectional plane 18 of the beam. The cross-sectional plane 18 may coincide with the pupil plane which acts as a virtual radiation source (as described above). The other sub-beams shown in FIG. 3 are reflected by the reflective elements 33c, 33d and re-directed by re-directing optics 16 so as to be incident at other points of plane 18. By controlling the orientations of the reflective elements 33a to 33e, almost any spatial intensity distribution in the cross-sectional plane 18 can be produced. For example, the array 33 comprises 1152 (e.g. 32×36) mirrors and the orientation of each mirror can be adjusted as discussed in detail below.

FIG. 4 and FIG. 5 show different spatial intensity distributions which may be produced by an illumination system according to the invention, for example, by the illumination system described in connection with FIG. 3, FIG. 6 and/or FIG. 7. FIG. 4 and FIG. 5 should be understood as schematic diagrams which illustrate the principle of producing a spatial intensity distribution using a plurality of sub-beams. The drawing plane of FIG. 4 and FIG. 5 coincides with a cross-sectional area of the beam, for example, the cross-sectional plane 18 of FIG. 3. FIG. 4 and FIG. 5 depict fifteen small circular areas 23 or 23a which represent areas with an illumination intensity greater than a threshold value. In FIG. 4, the circular areas 23 have a smaller size, and there are areas in between the circular areas 23 with an intensity smaller than the specific threshold value. The character of this illumination profile is discrete and might lead to unsatisfactory illumination. By increasing the range of directions into which the sub-beams of the circular areas propagate, for example by using optics as described above or in connection with FIG. 6 below, the circular areas 23a are enlarged so as to overlap each other. As a result, the intensity distribution shown in FIG. 5 has approximately the shape of a parallelogram. Since the sub-beams of the beam can be directed to any desired place of the cross-sectional area, almost any intensity profile can be produced. However, it is also possible to produce standard intensity distributions, e.g. with an annular shape. In particular, the area 21 in between the inner and outer circles of FIGS. 4 and 5 can be filled with circular areas 23 or 23a. The so-called σ-inner and σ-outer can be adjusted by directing the sub-beams to the corresponding places between the respective inner circle and the respective outer circle.

Figure 6:
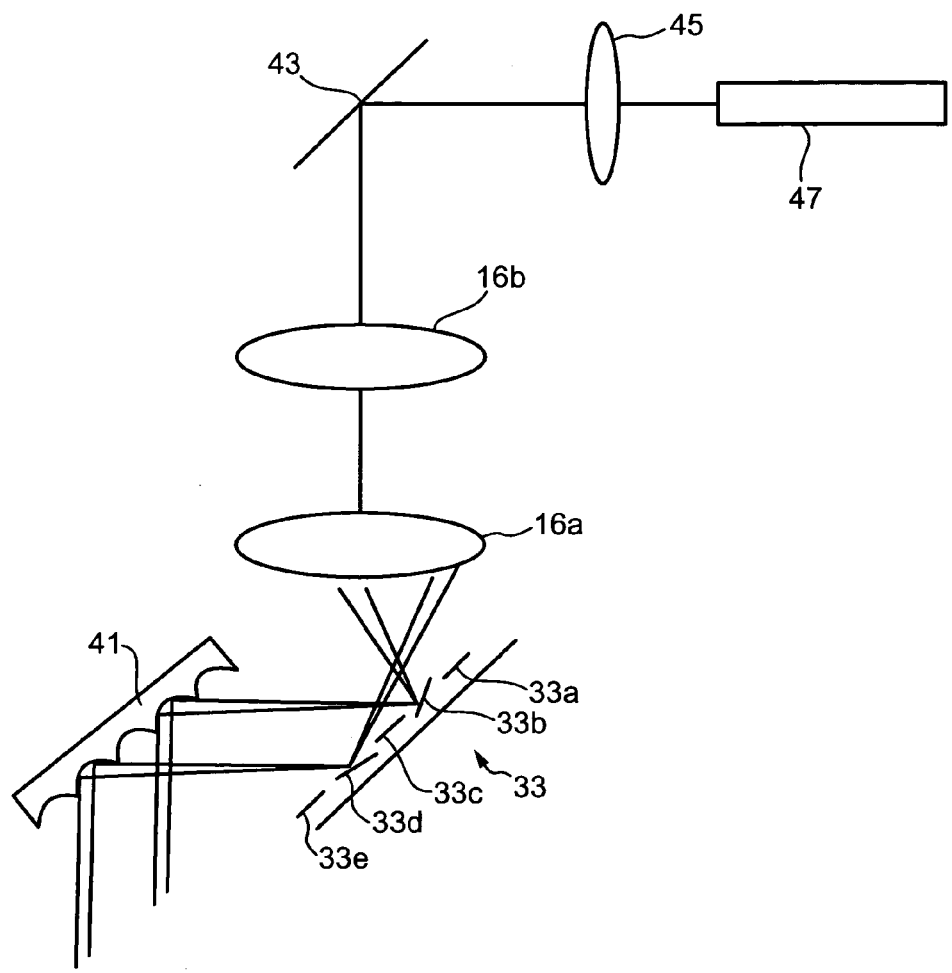
FIG. 6 schematically illustrates a radiation system of a lithographic apparatus according to a second embodiment of the present invention.

FIG. 6 shows a second embodiment of the present invention which may be the same as the first embodiment save as described below.

The beam is incident at concentrating optics 41 which may be the same as the divergence optics 32 of FIG. 3. The concentrating optics 41 fulfill two functions. First, the sub-beams of the beam are separated from each other. Second, the sub-beams are concentrated onto the reflective elements of the array 33. In particular, the concentration and separation is performed by reflective surface areas of the optics 41 with a parabolic or hyperbolic surface profile. It is preferred that surface areas which concentrate different parts of the beam onto different directing elements (reflective elements of the array 33, for example) are arranged side by side to each other so as to leave no gap in between. This means that a beam with a continuous intensity profile can be divided into separate sub-beams without significant loss of intensity.

The concentrating optics 41 may include a plurality of concentrating elements (not shown in FIG. 6) which are arranged at different locations along the propagation path of the beam. For example, a first concentrating element concentrates the radiation with respect to a first direction perpendicular to the direction of propagation to produce continuous lines or bands of concentrated radiation. In this embodiment, a second concentrating element concentrates the lines or bands with respect to a direction perpendicular to the first direction and perpendicular to the direction of radiation propagation. One advantage of this embodiment is that the manufacturing of the concentrating elements is facilitated, in particular, when the concentrating reflective surface areas are to be arranged side by side without leaving a gap in between.

The concentrating of parts of the beam corresponds to producing sub-beams which propagate into a defined range of directions. In the embodiment illustrated by FIG. 6, the sub-beams are reflected by the reflective elements of the array 33 to be incident at re-directing optics 16a, 16b. Downstream, the beam (as represented in FIG. 6 by the optical axis where the intensity might be zero) is reflected by a mirror 43 and is then coupled into an integrator 47, e.g. a quartz rod, by coupling optics 45.

Figure 7:
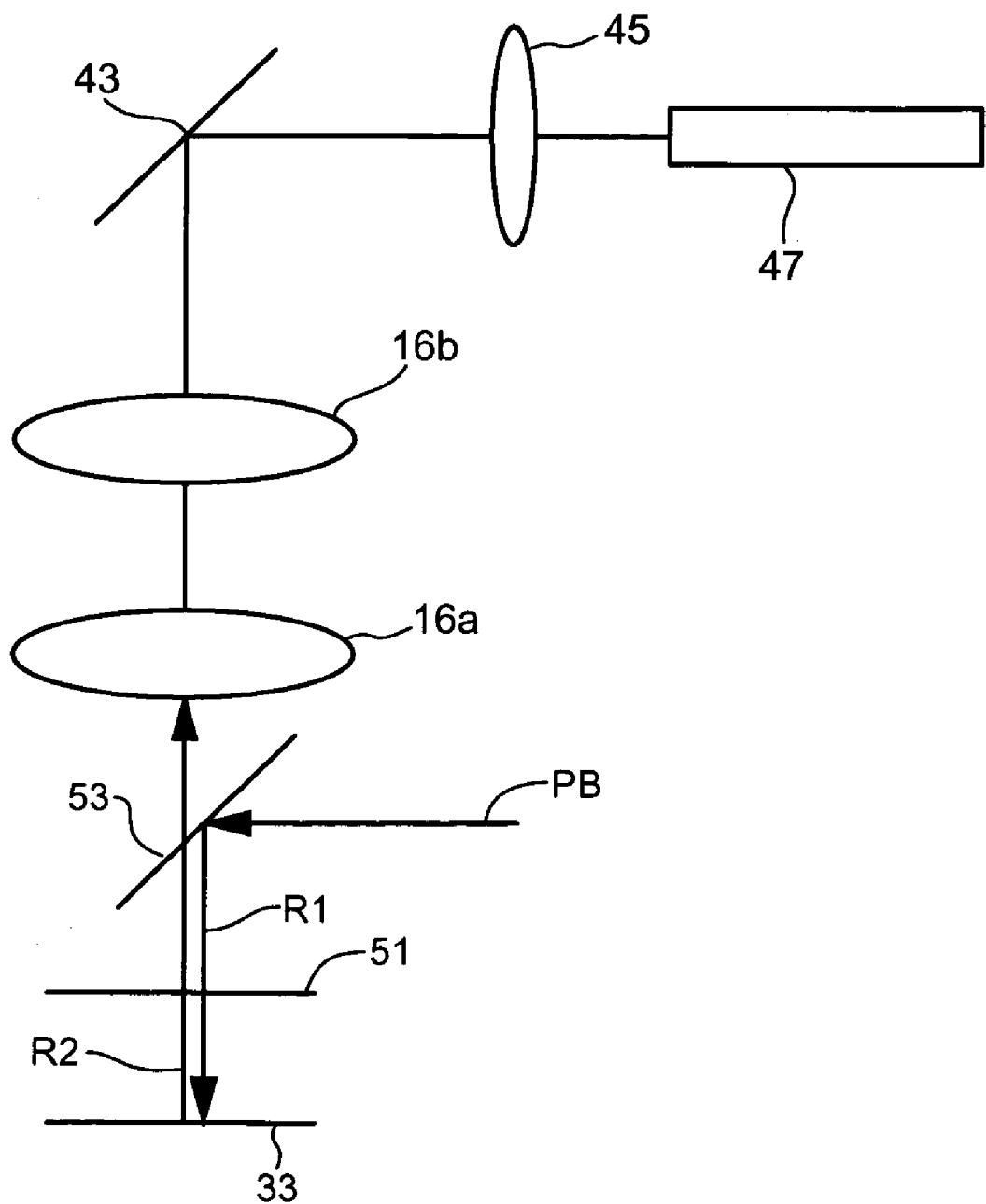
FIG. 7 schematically illustrates a radiation system of a lithographic apparatus according to a third embodiment of the present invention.

FIG. 7 depicts a third embodiment of the invention which may be the same as the first embodiment save as described below. A polarized incoming beam is incident at a polarization dependent mirror 53. The polarization of the beam is chosen so that a beam R1 is reflected (downwards in the illustration of FIG. 7). The polarization direction of the beam R1 is rotated when it transmits through a ¼ λ-plate 51. The beam R1 (with rotated polarization direction) is incident at the array 33. The corresponding sub-beams (not shown in FIG. 7) are reflected into different directions. These reflected sub-beams constitute beam R2 which transmits through the ¼ λ-plate 51 and, thereby, the polarization direction is again rotated. Due to the rotation of the polarization direction, beam R2 is not reflected by the polarization sensitive mirror 53, but transmits through. This embodiment allows for perpendicular illumination of the array of directing elements. Furthermore, the entire array is in the object plane of the rest of the beam shaping optics.

The array 33 of FIGS. 3, 6 and 7 includes a plurality, for example more than 1,000, of such reflective elements which can be aligned side by side to each other in a cross-sectional plane of the beam. Each reflective element may be a reflective member with a rectangular reflective surface area. It should be appreciated, however, that the reflective member can have any desired shape, for example a circular or hexagonal shape.

A fourth embodiment of the invention, which is the same as the first embodiment save as described below, employs faceted mirrors acting as a fly's-eye type integrator and is shown in FIGS. 8–15.

Figure 8:
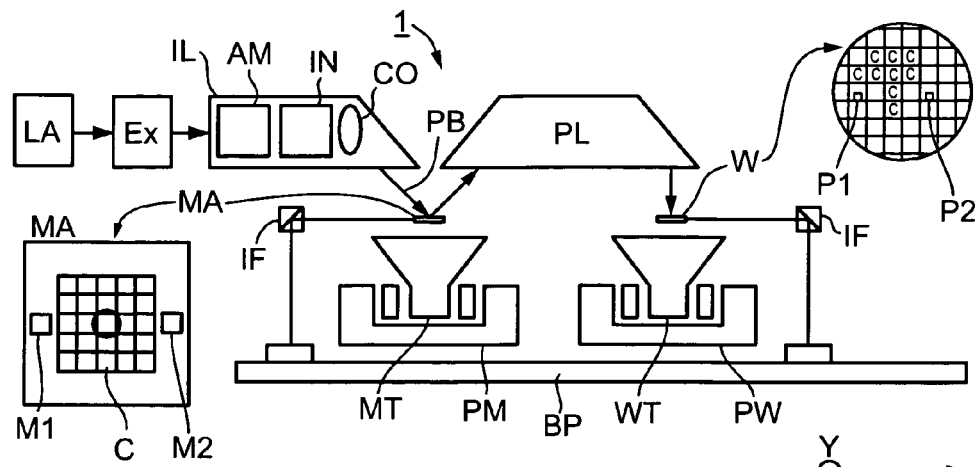
FIG. 8 schematically illustrates a lithographic projection apparatus according to a fourth embodiment of the present invention.

FIG. 8 depicts the overall layout of the fourth embodiment, which contains essentially the same components as the first embodiment but arranged around a reflective mask MA. Such an apparatus may employ EUV as the radiation of the projection beam. The radiation and illumination system employ reflective optics.

Figure 9:
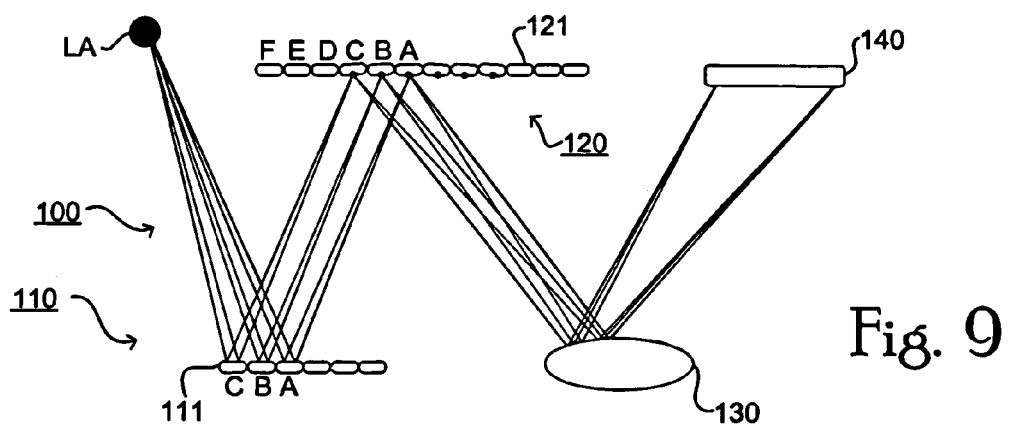
FIGS. 9–11 schematically illustrate the radiation system of a lithographic apparatus according to the fourth embodiment of the present invention in various different states.

The illumination system 100, shown in FIG. 9, includes a field faceted mirror 110 which has a plurality of field facets 111, each of which might have the shape of the illumination field (except for curvature added elsewhere in the illumination system), which form images of the source LA on a pupil faceted mirror 120. The images do not have to be good quality, nor lie exactly on the pupil faceted mirror 120. The pupil facets 121 of the pupil faceted mirror 120 direct the light to appropriately fill the illumination field on the mask 140, with the aid of a condenser mirror 130 (which may be a system of mirrors), which images the field facets 111 on the mask 140. Because the pupil faceted mirror 120 is in a conjugate plane of the pupil of the projection system PL, the illumination setting is determined by which of the pupil facets 121 are illuminated. This is controlled by controlling the orientations of the field facets 111. Each facet is significantly moveable in Rx (rotation about the X-axis), Ry (rotation about the Y-axis) and may be moveable in the Z direction (X, Y and Z denoting directions of an orthogonal coordinate system with the Z direction being the axis of the mirror). There are preferably more pupil facets 121 than field facets 111.

FIG. 9 shows the field facets 111 in a neutral position in which each field facet 111 directs light onto a correspondingly located one of the pupil facets 121. Thus, in FIG. 9, field facets 111A, 111B, and 111C direct light, respectively, to pupil facets 121A, 121B and 121C, respectively, in the middle of the pupil faceted mirror 120. Though rays are not shown for clarity, the other three unlabeled field facets illustrated direct light to the pupil facets 121 marked with a dot. A conventional uniform illumination mode is thereby produced.

Figure 10:
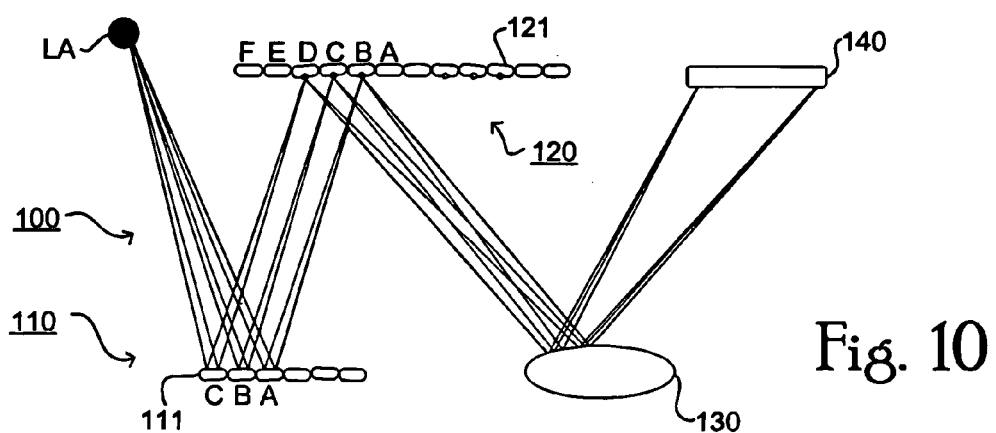

To generate an annular illumination mode, the field facets 111 are inclined by equal angles away from the center of the field faceted mirror 110 and illuminate the next pupil facet along from their "neutral" position. Thus, as shown in FIG. 10, the field facets 111A, 11B, and 111C direct light to pupil facets 121B, 121C, and 121D, respectively, where pupil facet 121D is the pupil facet outside the pupil facet 121C. As in FIG. 9, the three unlabelled field facets 111 direct light to the pupil facets 121 marked with dots, though for clarity the corresponding rays are not shown. The pupil facet 121A, which is central in the pupil faceted mirror 120, is not illuminated. The pupil facets 121B, 121C and 121D are also tilted to accommodate the slight change in angle of incidence of the radiation from the inclined field facets 111A, 111B, and 111C, respectively, while still correctly distributing the radiation into the illumination field.

Figure 11:
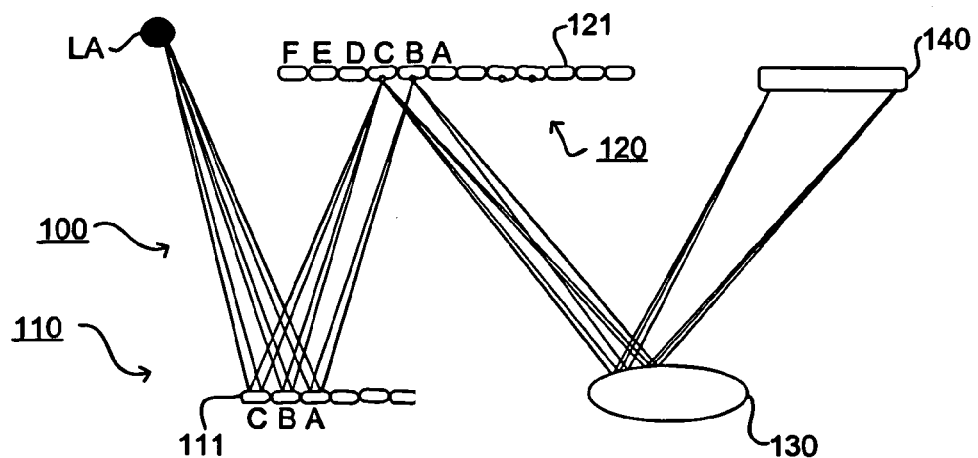

An annular illumination mode with a narrower annulus can be created by inclining the field facet 111C to direct radiation onto pupil facet 121C, at the same time as does field facet 111B, as shown in FIG. 11. Field facet 111A directs radiation onto pupil facet 121B. It will be appreciated that pupil facet 121C cannot be perfectly oriented to direct light from two different angles of incidence into the illumination field. Thus, there may be some small loss of intensity, but much less than if different illumination modes are effected by selectively obscuring the beam. Also, there may be a small change in the intensity profile of the illumination slit. If the field produced by each pupil facet 121 is smaller than the illumination field at the mask, which is made up by a large number of overlapping fields produced by the individual pupil facets 121, then it may be possible to position the pupil facet 121C at a position such that there is no radiation loss.

It will be appreciated that in practice there will be a much larger number of facets in the field and pupil faceted mirrors than shown in FIGS. 9–11, so that a much larger range of illumination settings can be achieved by applying the principles discussed above. Also, the field facets may be inclined so as to redirect light tangentially as well as radially to create illumination modes such as quadrupole and dipole, or more complex illumination modes optimized for specific mask patterns.

Figure 12:
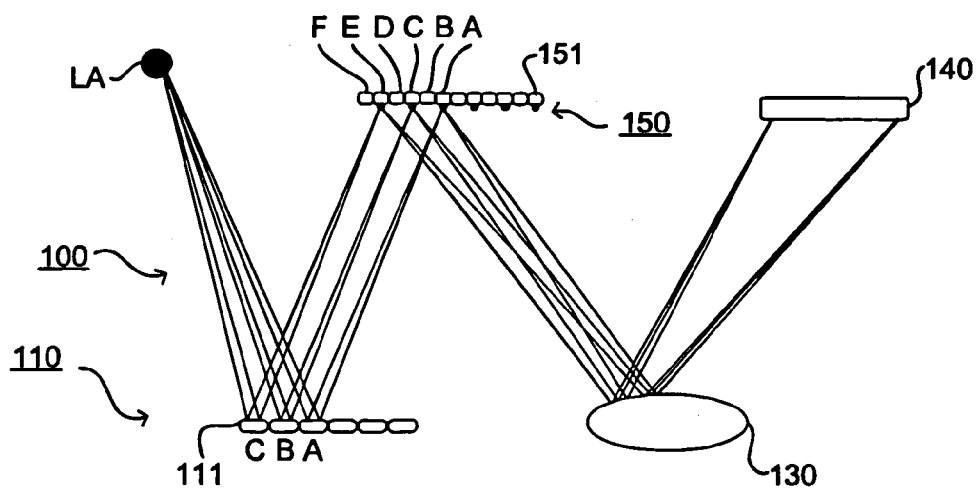
FIG. 12 schematically illustrates a radiation system of a lithographic apparatus according to a variant of the fourth embodiment.

A radiation system according to a variant of the fourth embodiment is shown in FIG. 12. In this variant, the pupil facets 151 are made smaller and at least twice as many pupil facets 151 are provided as field facets 111. The source images projected by the field facets 111 are also made correspondingly smaller. In this variant, the illumination mode can be changed with smaller step sizes and illumination modes can be arranged such that each pupil facet 151 receives only radiation for one field facet 111 avoiding the problems arising when a pupil facet receives radiation from more than one incident angle and cannot be optimally positioned. The pupil facets 151 in this variant may be grouped in pairs, or larger numbers, with the different members of a group oriented to receive radiation from a different angle of incidence, so that it is not necessary to shift the pupil facets 111 as the inclination of the field facets 151 are changed.

In a further variant of the fourth embodiment, shown in FIGS. 13 and 14, the field faceted mirror 170 comprises plural, for example four, arrays 171A–D of field facets 172. Each of field facets 172A, B, C etc. directs radiation onto a corresponding pupil facet 182A, B, C etc. in a corresponding array 181A on pupil faceted mirror 180. Different illumination modes are set by tilting the field facet arrays 171A–D as a whole and correspondingly displacing and tilting the pupil facet arrays 181A-D radially, or in other directions. In this arrangement, because four arrays are used, illumination modes from conventional, to quasi-annular to quadrupole can be obtained. A larger number of arrays allows additional modes.

With arrays of field facets tilted as a whole, illumination modes can be set continuously by using arrays in an interlaced meander, as shown in FIG. 15. The two arrays 191A, 191B meander in one direction and are interlaced. The arrays 191A, 191B direct radiation to groups of pupil facet mirrors 192A, 192B which have overlapping ranges of movement 193A, 193B. A meander in two directions is also possible. Note that it is not necessary for both the pupil or facet mirrors to be grouped, nor, if both are grouped, for the grouping to be the same.

Figure 16:
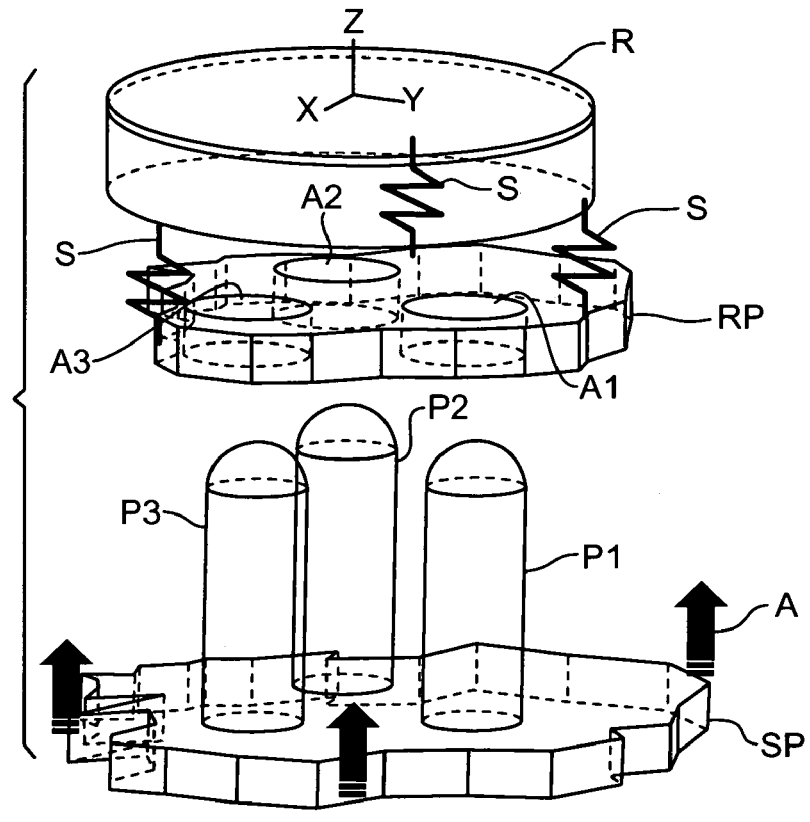
FIGS. 16–18 schematically illustrate a setting device according to an embodiment of the present invention.
Figure 17:
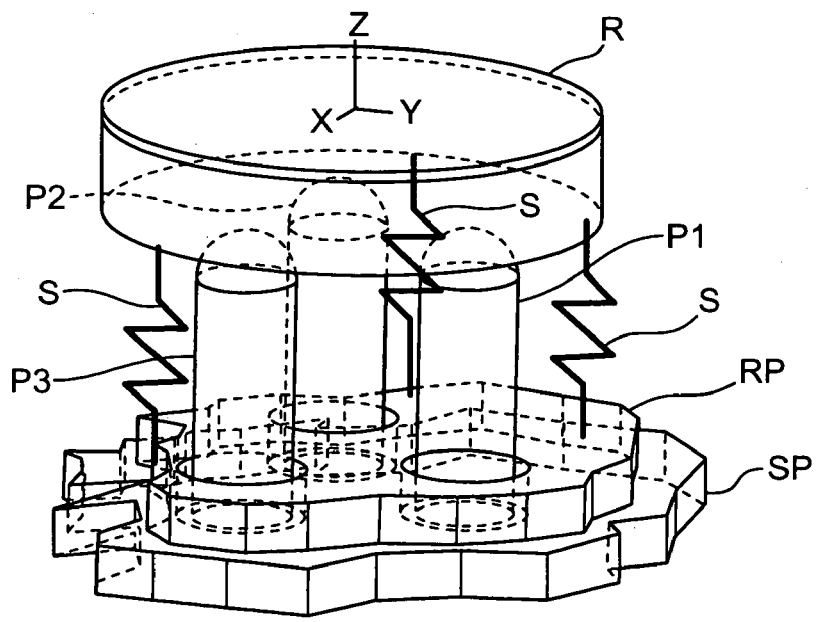
Figure 18:
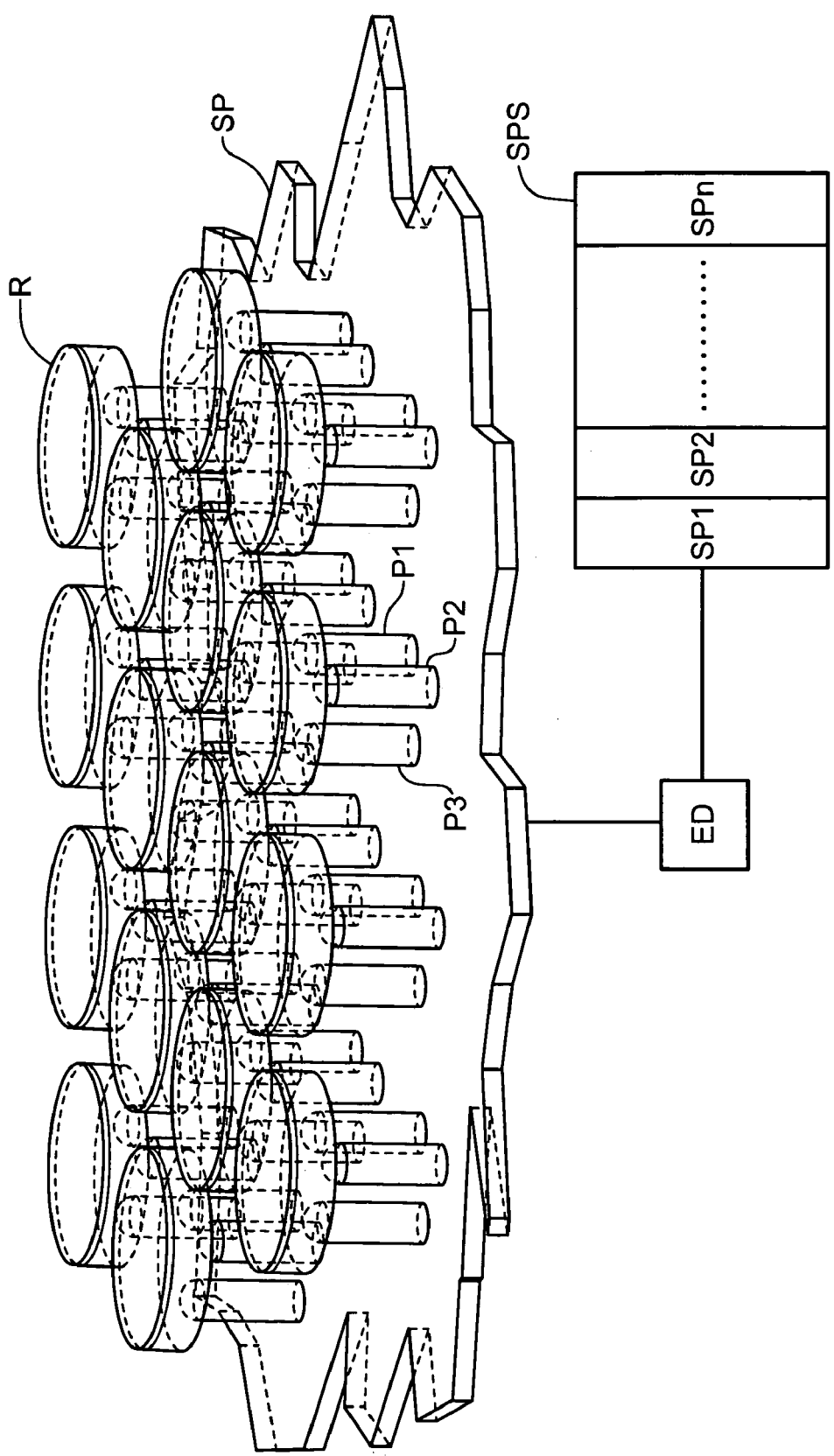

Referring to FIGS. 16–18, a setting device SD according to an embodiment of the present invention includes a setting plate SP including pins P1–P3. A reflector R is supported on a reflector plate RP by resilient members S, which may be springs, for example coil springs or leaf springs. Although three pins and three springs are shown, it should be appreciated that any number of pins and springs may be used, in any combination.

The reflector R may be a reflective element 33a–e as shown in FIGS. 3 and 6, a field facet 111 as shown in FIGS. 9–12, a pupil facet 121 and 151 as shown in FIGS. 9–11 and 12, respectively, a field facet array 171A–D as shown in FIG. 13, a pupil facet array 181A–D as shown in FIG. 14, or a field facet array 191A–B and a pupil facet mirror 192A–B as shown in FIG. 15.

The pins P1–P3 have heights H1–H3 that are predetermined to orient or position the reflector R according to a predetermined position when the pins P1–P3 engage the reflector R in the fully inserted position of the setting plate SP. The predetermined position of each reflector R corresponds to a position of the reflector R in a selected illumination mode, for example conventional, annular, dipole, or quadrupole. As shown in FIGS. 16 and 17, the setting plate SP is moved in the direction of arrow A to engage the reflector R. The pins P1–P3 pass through apertures A1–A3 in the reflector plate RP and engage the reflector to tilt or incline the directing element R around the X, Y, and/or Z axes at predetermined angles that correspond to the predetermined position of the reflector R for the particular illumination mode. FIG. 17 shows the setting plate SP in the fully inserted position. The resilient members S maintain the reflector R in contact with the pins P1–P3 and maintain the reflector R in the predetermined position.

Referring to FIG. 18, a plurality of reflectors R are positioned by a plurality of sets of pins P1–P3 on the setting plate SP. The plate RP and resilient members S are not shown in FIG. 18 for clarity. The plurality of reflectors R shown in FIG. 18 may correspond to the array 33 shown in FIGS. 3, 6 and 7, the field faceted mirror 110 shown in FIGS. 10–13, the pupil faceted mirrors 120 and 150 shown in FIGS. 10–12 and 13, respectively, the field faceted mirror 170 and pupil faceted mirror 180 shown in FIGS. 13 and 14, and the arrays and mirrors 191A, 1911B, and 192A, 192B shown in FIG. 15. Each pin in each set of pins P1–P3 has a height H1–H3 that is predetermined to tilt or incline the reflector R according to the predetermined position when the setting plate SP is in the fully inserted position. Again, it should be appreciated that each set of pins may include any number of pins and each reflector may be supported by any number of resilient members. For example, one set of pins may include two pins having heights calculated to tilt or incline the particular reflector a predetermined number of degrees about the X axis and a predetermined number of degrees about the Y axis. Another set of pins may include three pins to tilt or incline another particular reflector a predetermined number of degrees about the Z axis and a predetermined number of degrees about the Y axis. Any combination of the number of pins and the heights of the pins that produces the desired tilt or incline of the reflectors necessary to produce a particular illumination mode may be used. For example, only one pin per reflector may be used, the pin having a flat top surface, the orientation of the top surface corresponding with the desired orientation of the reflector R. In addition to determining the height of the pins necessary to produce the required tilt or incline, the placement of the pins on the setting plate may also be determined to produce the desired tilt or angle of the reflector. For example, the pins may be placed to engage the perimeter of the reflector or an intermediate portion of the reflector.

The heights and placement of the pins may be designed to accommodate placement of the setting device into the lithographic projection apparatus. Although the pins are shown as cylindrical and the surfaces that engage the reflectors are shown as generally hemispherical, it should be appreciated that the pins may be any shape, e.g., polygonal or oval, and the engaging surfaces may be any shape, e.g., planar, oval, or curvilinear.

In order to switch the illumination mode, the setting plate may be exchanged for another setting plate that has sets of pins designed to produce a different illumination mode. A plurality of setting plates SP1, SP2, . . . SPn may be placed in a setting plate storage SPS (e.g., a library), and the setting plates may be exchanged, for example by an exchanging device ED, such as a robot. It should be appreciated that the setting plates may be exchanged manually. The exchanging device ED may remove the setting plate SP from the fully inserted position shown in FIG. 18, place the setting plate SP in the storage SPS, remove one of the plurality of setting plates SP1, SP2, . . . SPn and insert the pins of the selected setting plate into the apertures of the reflector plate into the fully inserted position. In this way, the illumination mode may be changed.

The setting device SD according to the present invention eliminates the necessity of having a plurality of actuators for tilting or inclining each individual directing element, thus reducing the expense of manufacturing and maintaining a lithographic projection apparatus. A lithographic apparatus can thus be easily provided with a number of setting plates capable of producing the possible illumination modes.

While specific embodiments of the invention have been described above, it will be appreciated that the invention may be practiced otherwise than as described. The description is not intended to limit the invention.

We claim:

1. A lithographic projection apparatus, comprising:
   a radiation system configured to provide a beam of radiation;
   a support configured to support a patterning device, the patterning device configured to pattern the beam according to a desired pattern;
   a substrate table configured to hold a substrate; and
   a projection system configured to project the patterned beam onto a target portion of the substrate, wherein the radiation system comprises an illumination system configured to define an intensity distribution of the projection beam, the illumination system comprising a setting device configured to direct different pans of an incoming radiation beam into different directions to provide a desired angular intensity distribution of the beam at the patterning device, the setting device comprising a plurality of directing elements, each directing element configured to direct a pan of the incoming radiation beam, and an orientation of each directing element is set to direct the part of the incoming radiation beam into a desired direction, wherein the setting device comprises:
- a reflector plate configured to support reflectors;
- at least one resilient member associated with each reflector and configured to resiliently support each reflector on the reflector plate;
- at least one aperture in the reflector plate associated with each reflector; and
- a setting plate including at least one pin associated with each reflector, wherein the pins of the setting plate are insertable into the apertures of the reflector plate each at least one pin engaging its associated reflector to orient the associated reflector by rotation about two axes substantially perpendicular to the optical axis of the associated reflector.

2. An apparatus according to claim 1, wherein the two axes are orthogonal.

3. An apparatus according to claim 1, wherein the illumination system further comprises re-directing elements to re-direct at least a pan of the directed beam and to produce a spatial intensity distribution in a cross-section of the directed beam which corresponds to the angular intensity distribution.

4. An apparatus according to claim 3, wherein the cross-section is in a pupil plane.

5. An apparatus according to claim 3, wherein the illumination system further comprises a widening device that widens the range of directions into which the directed beam propagates.

6. An apparatus according to claim 5, wherein the widening device comprises a diffuser device.

7. An apparatus according to claim 6, wherein the diffuser device is a diffuser plate.

8. An apparatus according to claim 1, wherein the directing elements are arranged side by side to each other in a cross-sectional area of the incoming radiation beam.

9. An apparatus according to claim 1, wherein the illumination system further comprises a concentrating device constructed and arranged to concentrate parts of the incoming radiation beam onto the directing elements.

10. An apparatus according to claim 9, wherein the concentrating device comprises a reflective surface area having one of a parabolic and a hyperbolic three dimensional shape and an array of one of hyperbolic and parabolic reflective surfaces.

11. An apparatus according to claim 1, wherein the setting device comprises a first faceted reflector, each of the directing elements being a facet of the first faceted reflector and configured to project an image of a radiation source onto a selected facet of a second faceted reflector by setting of the orientation of each reflector.

12. An apparatus according to claim 1, wherein the setting device comprises a first faceted reflector, each of the directing elements being an array of facets, each facet configured to project an image of a radiation source onto a facet of a second faceted reflector.

13. An apparatus according to claim 11 or 12, wherein the orientation of each facet of the second faceted reflector is set by a second setting device.

14. An apparatus according to claim 11 or 12, wherein the second faceted reflector has more facets than the first faceted reflector.

15. An apparatus according to claim 11 or 12, wherein the second faceted reflector is located substantially in a conjugate plane of a pupil of the projection system.

16. A device manufacturing method, comprising:
providing a beam of radiation;
modifying the intensity distribution of the beam;
using a patterning device to endow the beam with a pattern in its cross-section; and
projecting the patterned beam of radiation onto a target which comprises at least a part of a radiation-sensitive material at least partially covering a substrate, wherein the modification of the intensity distribution of the beam includes setting the direction into which the radiation propagates using a setting device, wherein the beam comprises a plurality of sub-beams, wherein at least some of the sub-beams are directed into different directions using a plurality of reflectors, and orientations of the reflectors are set to direct the corresponding sub-beam into a desired direction, wherein the setting device comprises:
- a reflector plate configured to support reflectors;
- at least one resilient member associated with each reflector and configured to resiliently support each reflector on the reflector plate;
- at least one aperture in the reflector plate associated with each reflector; and
- a setting plate including at least one pin associated with each reflector, wherein the pins of the setting plate are insertable into the apertures of the reflector plate, each at least one pin engaging its associated reflector to orient the associated reflector by rotation about two axes substantially perpendicular to the optical axis of the associated reflector.

17. A method according to claim 16, wherein a predetermined angular intensity distribution of radiation propagation at the patterning device is produced by directing the sub-beams, the directed sub-begins contribute to a predetermined spatial intensity distribution of the beam in its cross-section, and each of the different directions of radiation propagation corresponds to one particular area of the spatial intensity distribution in the cross-section.

18. A method according to claim 17, wherein the one particular area is one specific local point in a focal plane.

19. A method according to claim 17, wherein at least one of the sub-beams is manipulated before it is directed so that the steered sub-beam propagates into a defined range of propagation directions.

20. A method according to claim 17, wherein the directed sub-beams each propagate essentially into a single direction.

21. A method according to claim 19, wherein the defined range of propagation directions of at least one of the steered sub-beams is increased so that the at least one directed sub-beam corresponds to an increased area of the spatial intensity distribution.

22. A device manufactured by the method of claim 16.

* * * * *